United States Patent [19]

Gaetano et al.

[11] 4,110,711

[45] Aug. 29, 1978

[54] VOICE/DATA RECEIVER COUPLED WITH A TRANSMISSION LINE THROUGH AN INPUT TRANSFORMER WORKING INTO AN IMPEDANCE APPROACHING A SHORT CIRCUIT

[75] Inventors: Mauro Luigi Gaetano, Woodbridge, Va.; Ambroz Karol Skrovanek, Bethesda, Md.

[73] Assignee: Harvey Hubbell, Incorporated, Orange, Conn.

[21] Appl. No.: 766,588

[22] Filed: Feb. 8, 1977

[51] Int. Cl.$^2$ ............................................. H03H 7/38
[52] U.S. Cl. ..................................... 333/32; 178/63 E
[58] Field of Search .............. 333/32; 178/63 R, 63 E

[56] References Cited

U.S. PATENT DOCUMENTS

| | | | |
|---|---|---|---|
| 1,752,046 | 3/1930 | Whittle | 333/32 X |
| 1,836,841 | 12/1931 | Dudley | 333/32 X |
| 2,194,534 | 3/1940 | Van Eldik | 333/32 |
| 3,456,206 | 7/1969 | Kwartiroff et al. | 333/32 X |

Primary Examiner—Paul L. Gensler
Attorney, Agent, or Firm—Jerry M. Presson

[57] ABSTRACT

A transmission line having a fixed characteristic impedance, e.g., 600 ohms, is coupled to a receiver through an input transformer working into a very small impedance, e.g., 10 ohms or less. As compared to a conventional arrangement, where an input transformer works into a load nearly as high as the characteristic impedance of the line, the new arrangement has considerably better low frequency response and delay distortion characteristics. The new arrangement permits a much smaller transformer to be used if desired while retaining favorable low frequency response and delay distortion characteristics.

10 Claims, 5 Drawing Figures

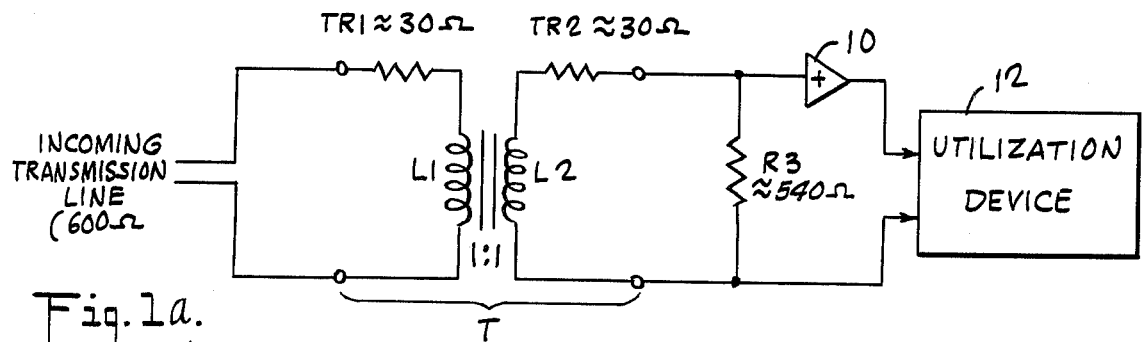

VOICE/DATA RECEIVER COUPLED WITH A TRANSMISSION LINE THROUGH AN INPUT TRANSFORMER WORKING INTO AN IMPEDANCE APPROACHING A SHORT CIRCUIT

BACKGROUND AND SUMMARY OF THE INVENTION

Certain types of voice/data receivers are connected to transmitters through transmission lines which may be the lines of the commercial telephone network. One of the parameters of a transmission line of this type is its characteristic impedance, which is the impedance that would be measured at the end of such a line if it were infinitely long. The importance of this characteristic impedance lies in the fact that if any length of line is terminated in an impedance of this value, all the energy flowing along the line is absorbed at the termination and none is reflected back along the line to interfere with the transmitted information. A result of this is that the input impedance of any length of transmission line terminated in its characteristic impedance is equal to its characteristic impedance.

In prior art receivers of this type, an incoming transmission line is connected to the primary winding of an input transformer which has, across its secondary winding, a load resistor whose value is nearly as high as the characteristic impedance of the line. For example, if the characteristic impedance of the line is 600 ohms, the load resistor connected across the secondary winding of the input transformer is about 600 ohms minus the transformer impedance, such that the combined impedance of the primary and secondary windings of the transformer and of the load resistor is approximately 600 ohms. A typical example of a prior art arrangement of this type is illustrated in FIG. 1 where an incoming transmission line is connected to the primary winding of a transformer T, this primary winding having an impedance made up of resistance TR1 of approximately 30 ohms and reactance L1. The secondary winding is similarly represented as resistive TR2 of about 30 ohms and reactance L2. The secondary winding has a load resistor R3 of about 540 ohms across it. For the relevant frequencies, i.e., in or about the audio range, the impedance in which the transmission line is terminated is approximately the sum of the resistive impedance components of the primary and secondary windings of the transformer T and the resistor R3, i.e., about 600 ohms, which is a proper match for a transmission line having a characteristic impedance of 600 ohms.

However, this proper match becomes a disadvantage when low frequency signals are being sent to transformer T over the transmission line. For example, when the signal is a rectangular positive voltage pulse of some width, there is a rise of the current through and voltage across R3 corresponding to the rise of this pulse, but then that current and voltage start decaying or "sagging" because the impedance of the secondary winding starts becoming very low as compared to the high value of R3 in the prior art example shown in FIG. 1. Stated differently, after the initial rise in the pulse, the secondary winding of T starts shorting out R3.

One measure of the low frequency response of networks of this type is the ratio of the resistance at the secondary winding of the input transformer to the inductance of the transformer. In the case of the FIG. 1 arrangement, this is the ratio of about 570 ohms (TR2 + R3) to the inductance of the input transformer, which may be, for example, about 3 to 4 Henry. This ratio is therefore in the range of about 190 to 140. The lower this ratio is the better the low frequency response of signals transmitted through the input transformer. In qualitative terms, this means that when this ratio is high, the sag discussed above is high and the height of a rectangular positive pulse is not maintained at R3. Conversely, when this ratio is low, the sag is low and the height of such a pulse is better maintained at R3. However, in the prior art this large load resistor R3 (causing a high ratio) was considered a necessity required by the constraint that the characteristic impedance of the line must be matched by the network terminating the line. The conflict had to be resolved in favor of a matched line termination because otherwise a reflected wave would be passed back onto the line and would interfere with the information signal being transmitted to the input transformer and perhaps with other information signals sharing the line. It is not practical to lower the ratio by increasing the inductance of the input transformer because of the unacceptable size and cost penalties that would ensue.

In accordance with the invention, and in contradiction to conventional design rules, an input transformer in an arrangement of this type works into substantially short circuit impedance. Despite this seemingly improper arrangement, the incoming transmission line is terminated into a proper impedance because suitable termination resistors are connected in series with the primary winding of the input transformer. The advantage of this seemingly improper arrangement is that the load resistance into which the input transformer works is very low, permitting the transformer coupling to have considerably improved low frequency response and less sag. In qualitative terms, the signal now faces the combination of the same inherent resistance of the secondary winding of the input transformer (provided the same transformer is used) but a much smaller load resistor. This smaller load resistor draws a greater proportion of the current at the secondary side of T as compared with R3 in FIG. 1, and tends to maintain a current flow and a potential difference with less sag. For example, using the same input transformer as in FIG. 1 but terminating its secondary winding in an actual or virtual resistance of about 10 ohms, as contrasted with 540 ohms in the FIG. 1 arrangement, and assuming that the secondary winding has an inherent resistance of 30 ohms and that the transformer inductance is 3 Henry, the frequency response measure for FIG. 1 would be about 190 while the same measure would be about 13 in an arrangement in accordance with the invention. This is an improvement in low frequency response by a factor of about 14 or 15 when the above-identified measure of low frequency response is used.

Referring to FIG. 1a for a qualitative illustration, the waveform 14' is the beginning of a wide positive pulse, the waveform 16' is the ideal response across R3, the waveform 18 is the response across a small load resistor in accordance with this invention, and the waveform 20 is the response across R3 in the prior art circuit of FIG. 1. In FIG. 1a the axis pointing up is voltage and the axis pointing to the right is time. This considerable improvement in low frequency response is present even if the input transformer is identical to the input transformer used in the corresponding prior art arrangements. Moreover, it is possible to use a substantially smaller, and therefor less costly and less bulky, input transformer and still retain the favorable characteristics resulting from using the invention. For example, if a less costly and less bulky transformer is used, e.g., with an inductance of only 1 Henry, everything else being the same, the low frequency response measure for an arrangement in accordance with the invention would be about 40, and if a still less costly and less bulky transformer is used, with a 0.3 Henry inductance, the low frequency response measure would be about 133, still being better than the 140 to 190 measure of the prior art arrangement of FIG. 1.

BRIEF DESCRIPTION OF THE DRAWINGS

FIG. 1 illustrates a prior art arrangement for terminating an incoming transmission line at a receiver.

FIG. 1a illustrates several voltage waveforms used in explaining the invention.

FIG. 2 illustrates a corresponding arrangement incorporating one embodiment of the invention.

FIG. 3 illustrates a corresponding arrangement incorporating another embodiment of the invention.

FIG. 4 is a prior art arrangement for coupling a transmitter to an outgoing transmission line.

DETAILED DESCRIPTION

As opposed to the conventional arrangement shown in FIG. 1, where the resistance into which the input transformer T works is nearly as high as the characteristic impedance of the transmission line, the arrangement incorporating an embodiment of the invention shown in FIG. 2 has the input transformer T' working into a resistance which is very small as compared to the characteristic impedance of the incoming transmission line. In the example illustrated in FIG. 2, where the characteristic impedance of the incoming transmission line is about 600 ohms, the load resistance connected across the secondary winding of the input transformer T' is a resistor R3' which is only about 10 ohms, and the secondary winding of the input transformer T is thus almost short circuited. Nevertheless, the incoming transmission line is properly terminated in an impedance of approximately 600 ohms which is made up of termination resistors R1' and R2' each of which is about 265 ohms, the inherent resistances TR1' and TR2' of the primary and secondary windings of the input transformer T', which are each about 30 ohms, and the load resistor R3' which is about 10 ohms.

If the new arrangement of FIG. 2 uses an input transformer T' which is similar in characteristics to the input transformer T used in the prior art arrangement in FIG. 1, the network including the load resistor R3' has a substantially better low frequency response and substantially lower distortion than the corresponding network of FIG. 1. Moreover, the arrangement in FIG. 2 can alternately use a smaller transformer, i.e., a transformer characterized by inductance in the range to about 0.2 to 0.4 Henry as opposed to the typical 3–4 Henry transformer of prior art arrangements of the type shown in FIG. 1.

For example, for identical transformers T and T', the improvement in low frequency response as between the arrangements of FIGS. 1 and 2 is roughly about the ratio of the resistances at the secondary windings of the transformer, i.e., the ratio of about 570 ohms (TR2 + R3) to about 40 ohms (TR2' + R3') or a factor of about 14. If a less costly and less bulky transformer is used, i.e., one with a lower inductance than the typical inductance of about 3–4 Henry of the transformer T, then the improvement in low frequency response is roughly the ratio between 570 ohms divided by the inductance of the costlier transformer to 40 ohms divided by the inductance of the less costly transformer. Equivalent frequency response as between the arrangements of FIGS. 1 and 2 would exist when the one of FIG. 1 uses a 3–4 Henry transformer, and the one of FIG. 2 uses a 0.2 to 0.3 or 0.4 Henry transformer.

As in the corresponding prior art arrangement, the voltage developed across the load resistor R3' due to signals transmitted over the incoming transmission line is amplified at a voltage amplifier 10' and the output of the amplifier is applied to a utilization network 12'. Amplifier 10' may be a conventional linear amplifier 741 (e.g., made by Motorola) operating in voltage amplification mode, while the network 12' may, as a simple example, be a tape recorder.

Similar advantages of the invention relating to improved low frequency response, less D.C. distortion and other characteristics are present in the alternate embodiment of the invention illustrated in FIG. 3, where a current amplifier 10'' is used in place of the voltage amplifier 10' of FIG. 2. In the arrangement of FIG. 3, there is no load resistor across the secondary winding of the input transformer T'', but there is a series combination of a current amplifier 10'' and a DC isolation capacitor C connected between one side of the secondary winding and a utilization device 12''. The amplifier 10'' is a conventional current amplifier having a bridging resistor RA. Since the current amplifier 10'' has a very low input impedance, the side of the secondary winding of the input transformer T'' connected to it is nearly grounded, and the improved low frequency response and other characteristics of the new arrangement discussed in connection with the arrangement in FIG. 2 are present in the arrangement of FIG. 3 as well. As one specific example, amplifier 10'' may be linear amplifier 741 (e.g., made by Motorola) operating in current amplification mode and bridged by a resistor RA having resistance of about 6,000 ohms. Assuming that the bottom side of the secondary winding of the transformer T'' and amplifier 10'' are at the same true or floating ground, then the virtual resistance that amplifier 10'' imposes across the secondary winding of the input transformer T'' is typically in the range of about 1–5 ohms. Capacitor C may have a value of about 1 microfarad, but that capacitor may be dispensed with altogether, for example, if the DC isolation of amplifier 10'' is considered sufficient.

The embodiment of the invention illustrated in FIG. 3 is to be distinguished from a prior art arrangement shown in FIG. 4 which is used for coupling a transmitter to an outgoing transmission line, as opposed to the arrangement for coupling an incoming transmission line to a receiver illustrated in FIG. 3. Referring to FIG. 4, a transmitter 14 generates voice/data signals applied to a current amplifier 16 through a resistor R6, e.g., of about 10,000 ohms. Amplifier 16 is bridged by a resistor RA', e.g., of about 27,000 ohms, and the amplifier output goes to the primary winding of an output transformer T4. The secondary winding of the output transformer T4 is connected to an outgoing transmission line, but there are two terminating resistors R6 and R7 interposed between the secondary winding of the output transformer T4 and the output transmission line. As opposed to some other prior art arrangements using a high load resistor across the primary winding of the output transformer T4 instead of resistors of the type of resistors R6 and R7, the arrangement of FIG. 4 has advantages related to low frequency response and delay time characteristics. However, this arrangement is limited to transmitters being coupled to outgoing transmission lines, as opposed to the invention here which is directed to coupling receivers to incoming transmission lines.

In accordance with the invention and consistent with the requirement that the transmission line be terminated in its characteristic impedance, the actual or virtual resistance in which the secondary winding of the input transformer is terminated may have values different from those indicated in the illustrative examples discussed in detail above. For example, load resistor R3' may be in the range of about 10 to about 50 or 100 ohms, it being understood that the indicated values of termination resistors R1' and R2' would each be reduced in resistance by an amount equivalent to half the increase in R3' over the indicated value of 10 ohms. It may also be possible to decrease the value of R3' to a new value below 10 ohms, but this may make the signal applied to amplifier 10' too low. Similarly, the virtual resistance which amplifier 10" in FIG. 3 imposes across the secondary winding of input transformer T" may have a different value, so long as the termination resistors R1" and R2" are adjusted such that the termination impedance matches the characteristic impedance of the incoming transmission line. Still similarly, a different input transformer may be used in place of input transformer T' or T", with different inherent resistances of its windings, in which case the shown resistance values will have to be changed to add up to a total resistance approximately equal to the characteristic impedance of the incoming transmission line.

We claim:

1. A device for receiving voice/data communication transmitted over a transmission line which has a selected characteristic impedance comprising:
    an input transformer having a primary and a secondary winding inductively coupled to each other, each winding having resistive impedance which is substantially less than the characteristic impedance of the transmission line;
    a first impedance network connected in series with the resistive impedance of the primary winding of the input transformer and having resistive impedance of the order of the characteristic impedance of the transmission line, said first impedance network being connected to the transmission line;
    a second impedance network connected to the secondary winding of the input transformer and having resistive impedance which is a small fraction of the characteristic impedance of the transmission line;
    the combined impedance of the first and second impedance networks and the resistive impedances of the windings being the impedance in which the transmission line is terminated and said combined impedance being approximately equal to the characteristic impedance of the transmission line; and
    a utilization network connected to the second impedance network to receive signals transmitted over said transmission line.

2. A device as in claim 1 where said second network comprises a load resistor which is connected across the secondary winding of the input transformer and has a resistance which is a small fraction of the characteristic impedance of the transmission line.

3. A device as in claim 2 where the resistance of the resistor is substantially less than the resistance of the secondary winding of the input transformer.

4. A device as in claim 3 including a voltage amplifier connected in series between, on the one hand, the parallel combination of the secondary winding of the input transformer and the resistor and, on the other hand, the utilization device.

5. A device as in claim 4 where the characteristic impedance of the transmission line is of the order of 600 ohms and the resistance of the resistor is of the order of 10 ohms.

6. A device as in claim 1 where the second impedance network comprises a series combination of a current amplifier and a DC isolation capacitor connected in series between the secondary winding of the input transformer and the utilization device and wherein the characteristic impedance of the transmission line is of the order of 600 ohms and the resistive impedance of the secondary winding of the input transformer is of the order of 30 ohms or less.

7. A device as in claim 1 where the characteristic impedance of the transmission line is of the order of 600 ohms, the resistive impedance of each of the primary and secondary windings of the input transformer is of the order of 30 ohms or less, and the second impedance network comprises a load resistor which is connected across the secondary winding of the input transformer and has a resistance of the order of less than 30 ohms.

8. A device for receiving voice/data communication transmitted over a transmission line which has a selected characteristic impedance comprising:
    an input transformer having a primary and a secondary winding inductively coupled to each other, each winding having a resistive impedance which is substantially less than the characteristic impedance of the transmission line;
    a first impedance network connected in series with the resistive impedance of the primary winding of the input transformer, said first impedance network being connected to the transmission line;
    a second impedance network connected to the secondary winding of the input transformer;
    the combined impedance of the first and second impedance networks and the resistive impedances of the windings being the impedance in which the transmission line is terminated and said combined impedance being approximately equal to the characteristic impedance of the transmission line;
    the resistive impedance of the first impedance network being at least a substantial portion of the characteristic impedance of the transmission line; and
    a utilization network connected to the second impedance network to receive signals transmitted over said transmission line.

9. A device as in claim 8 where the resistive impedance of the first impedance network is greater than the resistive impedance of the second impedance network.

10. A device as in claim 8 where the resistive impedance of the second impedance network is substantially less than that of the first impedance network.

* * * * *